United States Patent [19]

Crotti et al.

[11] Patent Number: 5,068,202

[45] Date of Patent: Nov. 26, 1991

[54] PROCESS FOR EXCAVATING TRENCHES WITH A ROUNDED BOTTOM IN A SILICON SUBSTRATE FOR MAKING TRENCH ISOLATION STRUCTURES

[75] Inventors: Pier L. Crotti, Landriano; Nadia Iazzi, Cremona, both of Italy

[73] Assignee: SGS-Thomson Microelectronics s.r.l., Brianza, Italy

[21] Appl. No.: 448,883

[22] Filed: Dec. 12, 1989

[30] Foreign Application Priority Data

Dec. 15, 1988 [IT] Italy .................. 83689 A/88

[51] Int. Cl.$^5$ ............................................. H01L 21/76
[52] U.S. Cl. .................................. 437/67; 437/70; 437/73
[58] Field of Search ................... 437/67, 69, 70, 73

[56] References Cited

U.S. PATENT DOCUMENTS

| 3,755,001 | 8/1973 | Kodi et al. ................ | 148/1.5 |
| 3,891,469 | 6/1975 | Moriyama et al. .......... | 437/70 |
| 4,271,583 | 6/1981 | Kahng et al. .............. | 437/73 |
| 4,538,343 | 9/1985 | Pollack et al. ............. | 437/70 |
| 4,942,137 | 7/1990 | Siuan et al. ................ | 437/73 |

FOREIGN PATENT DOCUMENTS

| 0284456 | 9/1988 | European Pat. Off. ...... | 437/73 |
| 0056437 | 4/1983 | Japan ....................... | 437/73 |
| 0202648 | 11/1984 | Japan ....................... | 437/73 |
| 0152155 | 6/1988 | Japan ....................... | 437/73 |

*Primary Examiner*—Olik Chaudhuri
*Assistant Examiner*—George R. Fourson
*Attorney, Agent, or Firm*—Bierman and Muserlian

[57] ABSTRACT

Encased (BOX) trench insolation structures in a silicon substrate are formed by firstly RIE etching an ONO multilayer (Oxide-Nitrite-Oxide) formed on the surface of a monocrystalline silicon substrate through a mask defining the active areas until exposing the silicon. A successive deposition of a conformable TEOS oxide layer followed by a "blanket" RIE etching, leave tapered "spacers" on the vertical etched flanks of the ONO multilayer. Through such a self-aligned "aperture" an isotropic plasma etching (round-etch) of the silicon is performed until the lateral, under-cut, etch front below the oxide spacers reaches the bottom layer of the isolation area defining etching previously conducted through the ONO multilayer. The peculiarities of the round-etch profile are thus fully exploited for more easily implanting the walls and bottom of the trench and avoiding the presence of electric field affecting sharp corners. The process maintains a precise lateral dimensional control and does not require special high resolution apparatuses.

1 Claim, 2 Drawing Sheets

PROCESS FOR EXCAVATING TRENCHES WITH A ROUNDED BOTTOM IN A SILICON SUBSTRATE FOR MAKING TRENCH ISOLATION STRUCTURES

BACKGROUND OF THE INVENTION

1. Field of the invention

The present invention relates to integrated circuits fabrication techniques and in particular to a technique for making trench isolation structures encased in a semiconducting substrate.

2. Description of the prior art

Compared with customary isolation structures made by thermally growing a thick field oxide layer over silicon areas defined by a silicon nitride mask, trench isolation structures (commonly known as BOX structures; an acronym for Buried OXide) offer potentially great advantages in terms of greater compactness and utilization of substantially "cold" processes for making them. Basically the encased trench isolation structure is made by pre-excavating the semiconductor substrate (monocrystalline silicon) and filling the trench with a dielectric material (generally a low-temperature chemically deposited silicon oxide) which advantageously may be planarized by any known technique.

Of course the walls of the trench formed in the semiconductor substrate for making the BOX isolation structure may be implanted customarily with a dopant in order to increase the doping level of the semiconductor material adjacent to the encased dielectric material.

The compactness requirement imposes very strict dimensional tolerances and excavating trenches among adjacent active areas on the front of the semiconductor device is problematic. The use of an intrinsically anisotropic RIE technique for the trench, though allowing a precise dimensional control of the etching performed through a photo-resist mask, produces a trench having excessively steep, substantially vertical, walls which are difficult to be implanted without recurring to special implantation techniques. Moreover the rather acute bottom corners of the etched trench may cause dangerous discontinuity effects in the electric field induced within the semiconductor substrate.

In order to overcome these drawbacks, recourse to a conventional isotropic plasma etching through a photo-resist mask has been proposed for exploiting the undercut effect of the isotropic etching in order to obtain an etching profile with a rounded bottom and inclined lateral walls, more easily implantable after removing the residual photoresist mask. Beyond a certain level of compactness of the integrated structures, this latter method is unusable. In fact, in order to compensate for the loss of lateral dimensional control due to the undercutting, which may be considered equal to the etch depth, the use of masks having aperture widths below the resolution limit of many presently used photolithographic apparatuses would be necessary. For example, in case of a 4Mbit device with a 2.2 μm pitch (active area: 0.8 μm; isolation: 1.2 μm), for a lateral under-cut of 0.5 μm each side, apertures of 0.4 μm should be photolithographically defined through the photoresist mask.

OBJECTIVE AND SUMMARY OF THE INVENTION

A main objective of the present invention is to provide a method, as defined in the accompanying claim, for forming an encased trench isolation structure free of the limitations and drawbacks of the known methods, while allowing the use of materials and apparatuses of a conventional type.

BRIEF DESCRIPTION OF THE DRAWINGS

FIGS. from 1 to 8 schematically depict the sequence of steps which characterize the method of the present invention.

DETAILED DESCRIPTION OF A PREFERRED EMBODIMENT OF THE INVENTION

Figure 1:
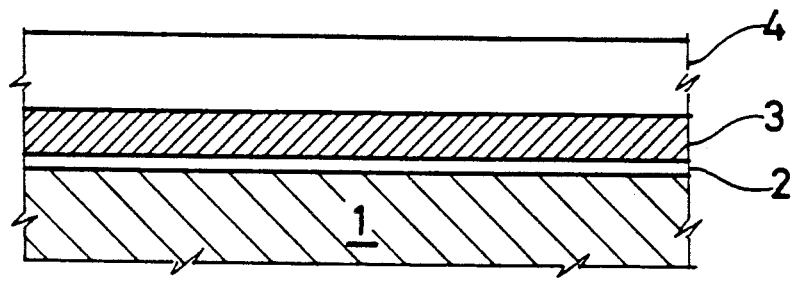

The process of the invention is applicable for example to a common p-type monocrystalline silicon wafer 1, which conventionally has been superficially oxidized for forming a thin layer 2 of oxide having a thickness comprised between 200 and 250 Angstroms (PAD oxide), over which a layer of silicon nitride 3 (or other material impervious to oxygen diffusion), with a thickness comprised between about 1500 and about 2000 Angstroms has been deposited and on top of which a further layer of oxide 4 having a thickness comprised between about 2500 and about 4500 Angstroms, commonly a silicon oxide deposited by a chemical vapor deposition technique is formed, as depicted in FIG. 1.

The areas where the isolation structure must be formed are photolithographically defined in their actual dimensions on the front of the device, by using standard procedures of photoresist coating, exposing, developing and subsequently etching the said layers through the photoresist mask in a RIE reactor until exposing the surface of the underlying semiconductor substrate 1 in the unmasked areas and subsequently removing the residual masking photoresist.

Figure 2:
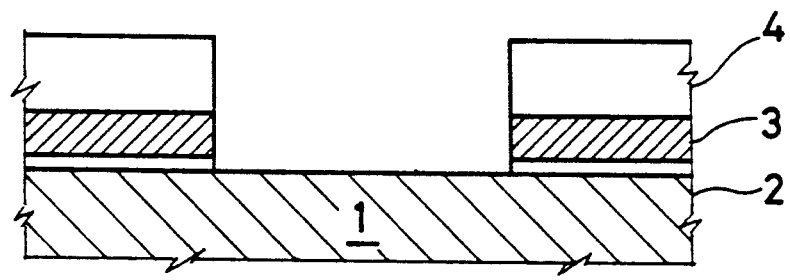

At this point the cross-section of the device is depicted in FIG. 2, wherein the substantially vertical etch walls produced by the RIE process through the ONO (an acronym for Oxide-Nitride-Oxide) multilayer which si constituted by said three layers 2, 3 and 4 previously deposited on the silicon.

Figure 3:
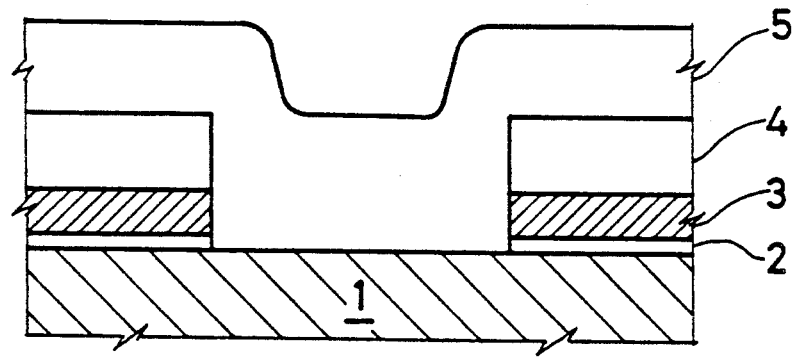

By means of chemical vapor deposition preferably performed in a low-temperature oven, a further layer 5 of silicon oxide having a thickness comprised preferably between about 5000 and about 7000 Angstroms is conformably deposited. A tetra-ethyl-ortho-silicate may be employed as a precursor compound for producing substantially a vitreous layer 5 of silicon oxide, thus obtaining a cross section as depicted in FIG. 3.

Figure 4:
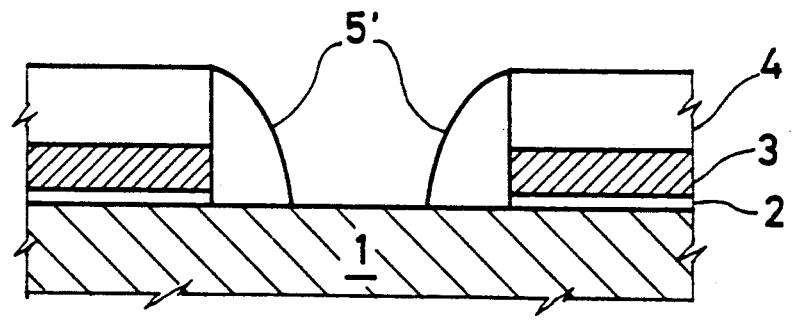
Figure 5:
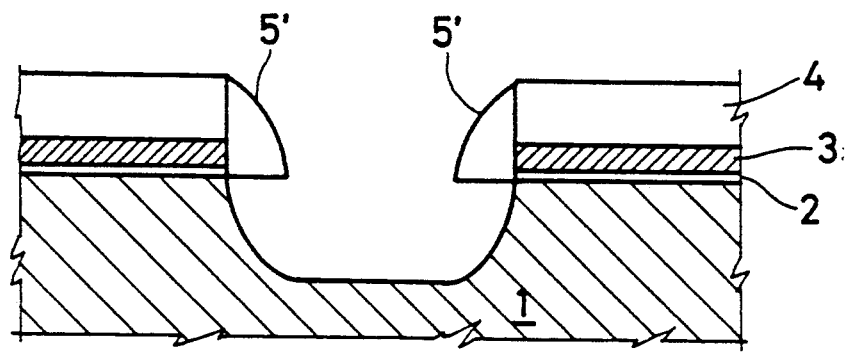

At this point a "blanket" (i.e. strongly anisotropic) etching in a RIE reactor of the conformably deposited oxide layer 5 is performed until exposing the surface of the underlying semiconducting silicon substrate, which exposure will occur, as depicted in FIG. 4, in a central area, self-aligned in respect to the substantially larger area defined originally by means of the photoresist mask. This processing leaves a tapered residue 5' of oxide over the vertical etch walls of the ONO multilayer created by the first anisotropic etching in a RIE reactor through the photoresist mask. By exploiting as a "spacer" the tapered residue 5' of the conformably deposited and subsequently etched layer of oxide, for setting further away from the defined edges of the isolation area the point of the beginning of the etching, a selective and essentially isotropic etching of the semi-conductor (silicon) is performed, preferably using a $CF_4 + O_2$ plasma in a "down-stream" type etching apparatus (e.g. a Branson apparatus, type L 3200). The etching of the semiconducting silicon substrate 1 is carried out for a sufficient depth, preferably about 5000±250 Angstroms, thus producing a trench having a desired rounded bottom, the relative under-cut of which, below the base of the tapered residue 5' of silicon oxide, encroaches in a substantially isotropic manner until coinciding substantially with the bottom edge of the vertical walls created by the prior etching for defining the isolation area through the said layers of oxide 4, nitride 3 and of PAD oxide 2, as depicted in FIG. 5.

Figure 6:
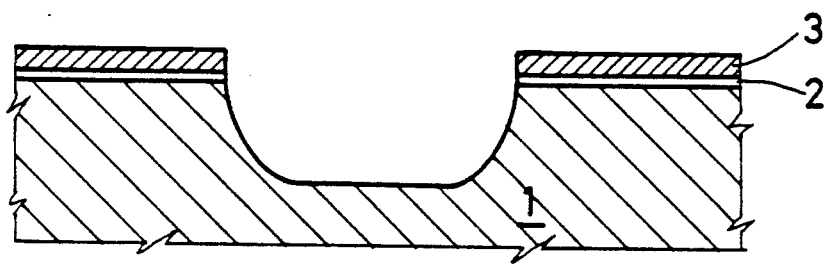

An oxide etching is then carried out for completely removing the tapered residues 5' as well as the oxide layer 4 until exposing the layer of nitride 3, as depicted in FIG. 6.

By utilizing the nitride layer 3 as a mask, the implantation of a dopant (e.g. boron) for increasing the doping level of the silicon immediately adjacent to the isolation trench, in accordance with a common technique, is thus made extremely easy. Preferably after having implanted the dopant species in the silicon (which is illustratively shown by the crosses in FIGS. 7 and 8), the surface of the trench formed in the semiconducting substrate 1 is thermally oxidized for growing a thermal oxide layer 6 having a thickness comprised between about 800 and about 1200 Angstroms.

Figure 7:
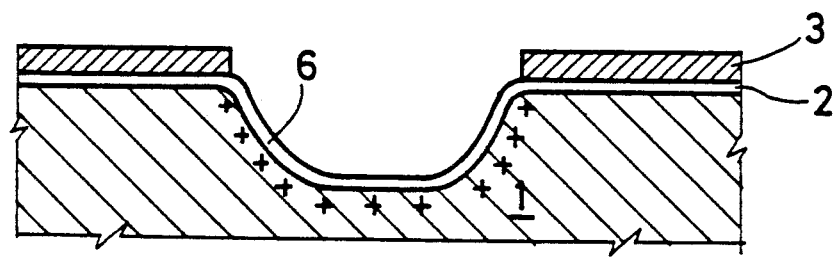

As schematically shown in FIG. 7, the growth of the thin thermal oxide layer 6 beside facilitating the subsequent filling of the trench with a dielectric material, induces further a beneficial rounding of the edges of the trench by a linking of the growing oxide layer with the thin PAD oxide layer 2 already present underneath the nitride layer 3.

Figure 8:
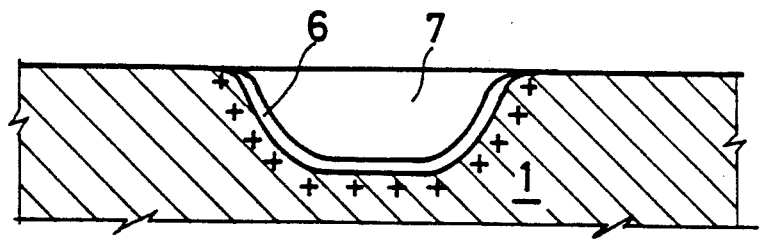

After having removed the nitride layer 3, the isolation trench is filled with a dielectric material, preferably with a dielectric oxide deposited by chemical vapor deposition conducted at a relatively low temperature and using a precursor compound such as tetra-ethyl-ortho-silicate. After having carried out a customary planarization step, eventually ending it by removing also the originally formed thin layer 2 of PAD oxide, the cross-section of the so completed trench isolation structure, encased in the semiconducting substrate, is depicted in FIG. 8.

What we claim is:

1. A process for making an encased isolation structure for an integrated semiconductor device having the configuration of a trench, excavated on the surface of a semiconducting substrate of a first conductivity type around active areas of the front of the device and filled with a dielectric material, said semiconducting substrate having been previously covered by a multilayer composed of a first oxide layer, a second layer of a diffusion resistant material superimposed thereto, and a third or top layer of oxide which is thicker than the first oxide layer;

characterized by comprising the following steps:
a) masking with a photoresist by a photolithographic process active areas on the front of the device;
b) anisotropically etching by means of a RIE process said three layers until exposing the surface of the underlying semiconducting substrate in the unmasked area and removing the residual masking photoresist;
c) conformably depositing a fourth oxide layer;
d) anisotropically etching by means of a RIE process said conformably deposited fourth layer of oxide until exposing the surface of the underlying semiconducting substrate in a central, self-aligned area of said unmasked area, and leaving a tapered residue of said conformably deposited fourth layer of oxide on vertical etch walls of said three layers etched during the preceding step b);
e) isotropically plasma etching said semiconducting substrate through said exposed central, self-aligned area until forming a trench having a desired depth and causing a lateral under-cut roundly extending below the base of said tapered residue of said conformably deposited fourth oxide layer;
f) removing the residual exposed oxide belonging to said third layer and to said fourth layer;
g) implanting on the etched trench surface a dopant of the same conductivity type as the semiconducting substrate for increasing the doping level of the semiconductor material adjacent to the etched trench surface by utilizing said second layer of diffusion impervious materials as a mask;
h) thermally growing a thin layer of oxide over the etched and implanted surface of the trench formed in the semiconducting substrate, by utilizing said second layer of diffusion impervious material as a mask;
i) removing said second layer of diffusion impervious material;
j) depositing a layer of dielectric material until completely filling the trench formed in the semiconducting substrate.

* * * * *